United States Patent
Glogovsky et al.

(10) Patent No.: US 6,895,134 B2
(45) Date of Patent: May 17, 2005

(54) INTEGRATED OPTOELECTRONICS DEVICES

(75) Inventors: Kenneth Gerard Glogovsky, Kempton, PA (US); Charles William Lentz, Reading, PA (US); Abdallah Ougazzaden, Emmaus, PA (US); Claude Lewis Reynolds, Jr., Sinking Spring, PA (US)

(73) Assignee: Triquint Technology Holding Co., Hillsboro, OR (US)

( * ) Notice: Subject to any disclaimer, the term of this patent is extended or adjusted under 35 U.S.C. 154(b) by 512 days.

(21) Appl. No.: 10/007,289

(22) Filed: Nov. 10, 2001

(65) Prior Publication Data

US 2004/0202402 A1 Oct. 14, 2004

(51) Int. Cl.[7] .......................... G02B 6/12; H01L 29/06; H01L 21/00
(52) U.S. Cl. .............................. 385/14; 257/14; 438/31
(58) Field of Search ..................... 385/14, 31; 254/14; 438/31

(56) References Cited

U.S. PATENT DOCUMENTS

| | | | | |
|---|---|---|---|---|
| 5,001,522 A | * | 3/1991 | Takahashi et al. | 257/14 |
| 5,309,003 A | * | 5/1994 | Luryi | 257/194 |
| 6,158,901 A | * | 12/2000 | Kovacic | 385/88 |
| 6,376,272 B1 | * | 4/2002 | Bond et al. | 438/31 |
| 2004/0096175 A1 | * | 5/2004 | Tolstikhin | 385/131 |

* cited by examiner

Primary Examiner—John D. Lee
Assistant Examiner—Tina M. Lin

(57) ABSTRACT

The invention is an optoelectronic device and method of fabrication where at least two optical devices are formed on a single semiconductor substrate, with each optical device including an active region such as a multi-quantum well region. The active devices are spatially separated and optically coupled by a passive waveguide formed over the substrate which provides butt joints with the active regions. The butt joints can be optimized independently from the active regions thus improving yield.

16 Claims, 4 Drawing Sheets

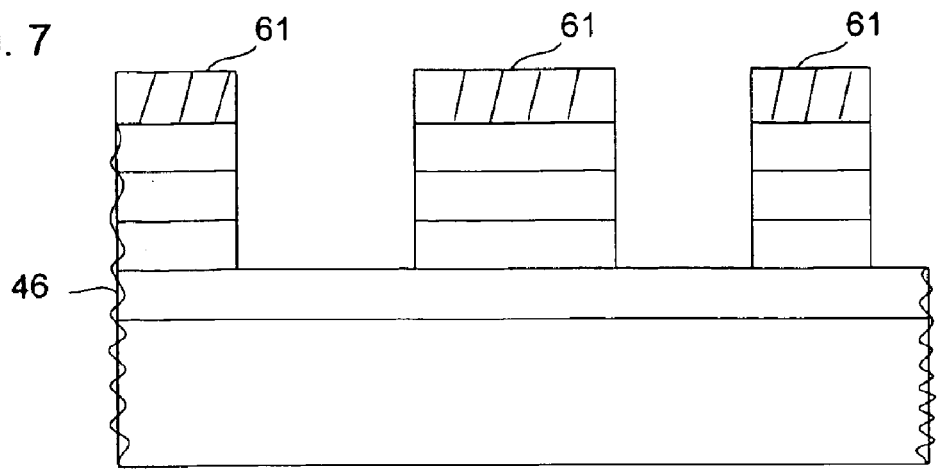
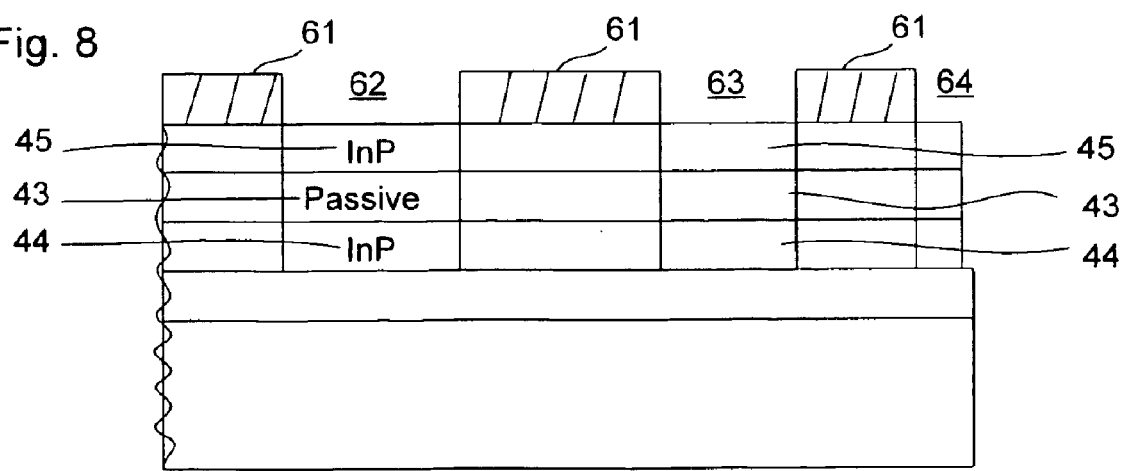

INTEGRATED OPTOELECTRONICS DEVICES

FIELD OF THE INVENTION

This invention relates to the field of optoelectronics, and in particular to a structure and method which permits integration of at least two optoelectronic devices on a single substrate.

BACKGROUND OF THE INVENTION

Optical systems are currently the subject of a great deal of attention in telecommunications primarily due to their enormous information-handling capacity. A typical system includes, at the transmitter end, a source of light, such as a laser, a modulator for impressing information onto the light signal, and one or more optical amplifiers for amplifying the optical signal. The signal is usually transmitted by means of an optical fiber. At the receiver end, typically a photodetector such as a PIN diode or avalanche photodiode (APD) may be employed to convert the optical signal to an electrical signal. Of course, several other components, such as optical switches, circulators, and isolators may be employed.

For purposes of economy and size it is desirable to integrate as many devices as possible on a single substrate. For example, it is known to integrate a laser and modulator into a single device generally known as an Electroabsorption Modulated Laser (EML). It is also known to integrate a Distributed Bragg Reflection (DBR) laser, a modulator, a Semiconductor Optical Amplifier (SOA) and a monitor onto a single substrate. Normally, when integrating active device components (i.e., devices which provide optical gain), the devices are formed by Selective Area Growth (SAG) with modifications to the composition, thickness, or number of Quantum Well layers in the active regions of the various devices. In the case of two active devices, it is difficult to optimize the device characteristics and the butt joint which couples the two devices together. In the case of three or more devices, the problem of optimization becomes especially difficult.

It has been proposed to couple active devices in an integrated structure using a passive waveguide. (See, e.g., U.S. Pat. No. 5,134,671 issued to Koren et al, and U.S. Pat. No. 5,029,297 issued to Halemane, et al.) However, such devices provide coupling between waveguide and device in a vertical direction which can also be difficult to make since the waveguide needs to be formed in the same growth process as the active devices. It is generally more advantageous to provide a butt coupling between devices (i.e., the light coupling is done in a horizontal direction) so that the coupling is optimized independently from the active devices.

It is desirable, therefore, to provide an integrated optoelectronic device with at least two active components where device characteristics and butt joint coupling may be optimized.

SUMMARY OF THE INVENTION

The invention in accordance with one aspect is an optoelectronic device comprising at least two optical devices formed on a single semiconductor substrate, each optical device including an active region. The active devices are spatially separated and optically butt coupled by a passive waveguide formed on the substrate.

In accordance with another aspect, the invention is a method of forming an optoelectronic device comprising the steps of forming a plurality of epitaxial semiconductor layers on essentially the entire surface of a semiconductor substrate, the layers including at least one layer of an active material. The layers are then selectively etched to form spatially separate structures including the active material. An additional plurality of layers are then formed in the spaces between the structures, the additional layers including at least one passive waveguide layer so as to provide optical butt coupling between the active material of the separate structures.

BRIEF DESCRIPTION OF THE FIGURES

These and other features of the invention are delineated in detail in the following description. In the drawing:

FIGS. 3–8 are cross sectional views of the device of FIG. 2 during various stages of manufacture in accordance with an embodiment of the method aspects of the invention.

It will be appreciated that, for purposes of illustration, these figures are not necessarily drawn to scale.

DETAILED DESCRIPTION

Figure 1:
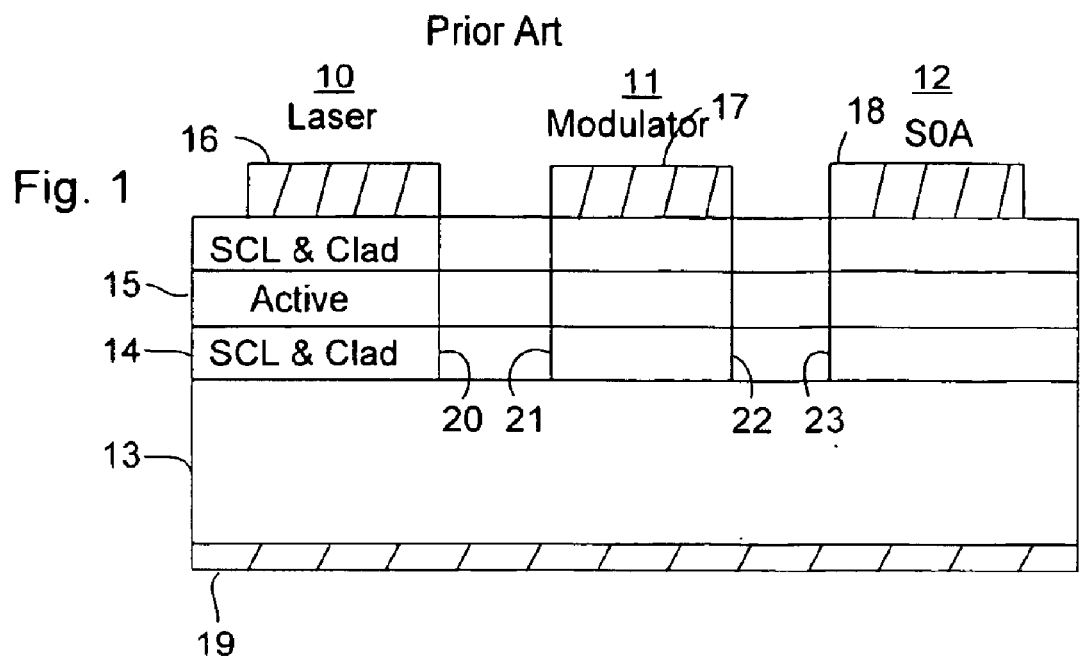
FIG. 1 is a cross sectional view of one example of a prior art optoelectronic device.

One example of a prior art device is illustrated in FIG. 1. Merely by way of illustration, the device includes three active devices, a laser, 10, a modulator, 11, and a semiconductor optical amplifier (SOA), 12, formed on a semiconductor substrate, 13. Many other components can also be included, such as photodetectors. Each device includes a cladding or combination of cladding and Separate Confinement layers, 14, formed on the surface of the substrate, 13, an active layer, 15, deposited on the cladding layer, and another cladding/SCL layer, 16, deposited on the active layer. Other layers typically used, such as buffer layers and contact layers, are not shown for the sake of clarity. It will also be appreciated that the active layer, 15, can comprise a single Multi Quantum Well (MQW) layer or a plurality of MQW layers separated by barrier layers (not shown) as known in the art. Electrodes, 16–18, are selectively formed over the device structures, and electrode 19 is typically formed over the opposite surface of the substrate.

Typically, such devices are formed by depositing the various layers by Selective Area Growth (SAG) techniques. Varying the shape or size of the mask along the substrate can produce variations in composition and/or thickness of the active layer, 15, in the device regions, 10, 11, and 12, with a single deposition resulting in the desired device performances. The deposition also results in butt joints, illustrated by lines 20–23, which provide horizontal coupling between the devices. Thus, the device of FIG. 1 includes an active layer, 15, which constitutes the active regions of the individual devices, 10–12, as well as the interconnection between the devices (although the composition and/or thickness of the layer, 15, will be varied across the device structure). A problem with such a technique is the difficulty in finding a growth condition which will optimize all the devices, 10–12, as well as the butt joints, 20–23. This problem is especially acute when the active regions of the devices comprise one or more MQW layers, and the integrated device is intended for use at 10 Gbit for distances of at least 50 km or for use at 40 Gbit.

Figure 2:
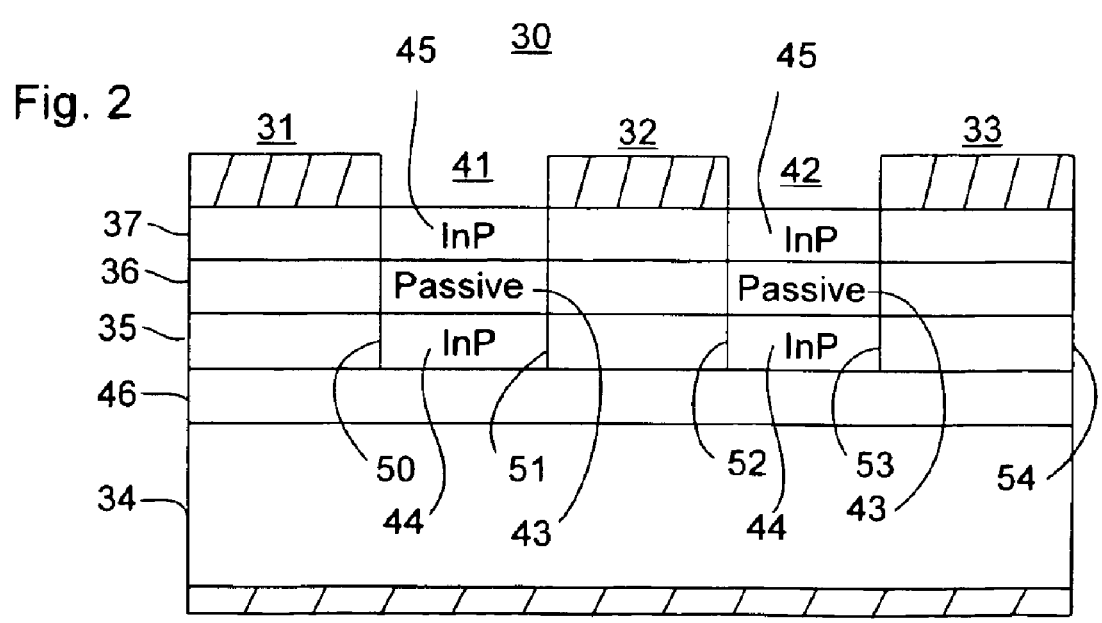
FIG. 2 is a cross sectional view of an optoelectronic device in accordance with one embodiment of the invention.

FIG. 2 illustrates a device structure in accordance with an embodiment of the invention. Again, the device, 30, includes a laser, 31, a modulator, 32, and an SOA, 33, integrated onto a single substrate, 34. As before, each component, 31–33, comprises a cladding/SCL layer, 35, an active layer, 36, and another cladding/SCL layer 37. However, rather than provide interconnection of the components by moans of an active waveguide, the interconnections are made by a structure, 41 and 42, which includes a passive waveguide layer, 43. In this particular example, the passive waveguide layer, 43, is sandwiched between SCL layers, 44 and 45. In a preferred embodiment, the layers 43–45, can be formed sequentially in all the areas between components at the same time, i.e., the same layers will comprise the interconnections between all components. The device, 30, also preferentially includes a layer, 46, formed over essentially the entire substrate surface. The layer comprises a composition, such as InGaAsP, which can perform the function of a stop etch in the processing to be described.

Another distinction in the device of FIG. 2 is the fact that the active and cladding/SCL layers of any component, 31–33, are not necessarily formed at the same time as the corresponding layers of any other component, and, therefore, can be independently optimized.

It should be appreciated that one of the advantages of the structure of FIG. 2 is that the butt joints, 50–54, formed by the passive waveguide layer, 43, and SCL layers, 44 and 45, can be optimized independently from the optimization of the active regions of the components, 31–33. Further, since the passive waveguide layer is typically undoped, improved electrical isolation and reduced optical loss can be achieved.

It should be understood that in the context of the present application, an active waveguide layer is considered to be any semiconductor layer which will generate light or absorb light in response to an applied bias. A passive waveguide layer is considered to be any semiconductor layer which will channel the light without generating any light or absorbing any significant amount of the light (less than 0.1 dB loss).

FIGS. 3–8 illustrate a sequence of steps which can be performed in accordance with an embodiment of the method aspects of the invention in order to produce the device of FIG. 2. In this particular example, all semiconductor layers are formed by Metal Organic Chemical Vapor Deposition (MOCVD), but other known techniques can be employed.

Figure 3:
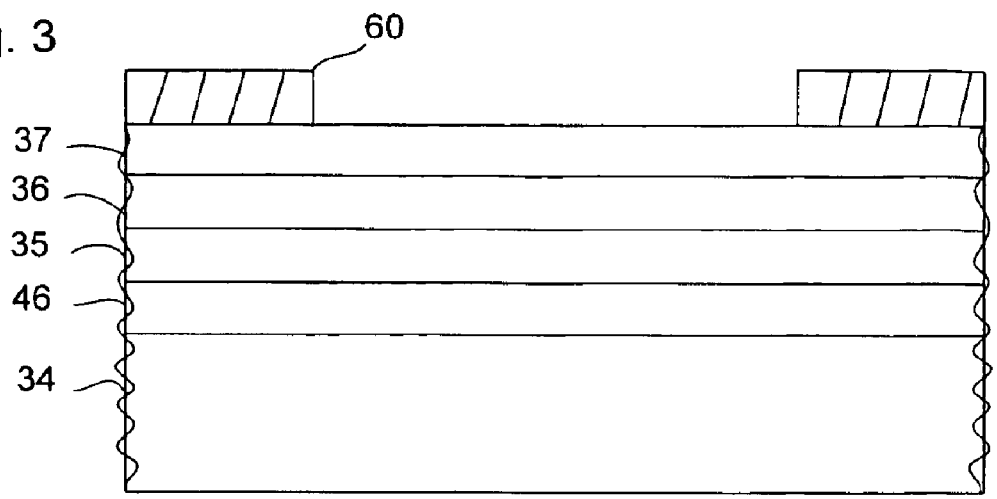

As illustrated in FIG. 3, the substrate in this example comprises InP. Formed over essentially an entire major surface of the substrate is a stop etch layer, 46, which in this example comprises InAlAs or GaInAlAs. Any material which performs the stop etch function to be described can be employed. The layer, 46, is typically 0.1 to 0.5 microns thick. Formed on the stop etch layer, 46, is a combined cladding/SCL layer, 35. In this example, the layer, 35, comprises an n-type layer of InP with a thickness in the range 0.02 to 0.3 microns, and an n-type layer comprising InGaAsP with a thickness in the range 0.02 to 0.05 microns. The former layer is a standard cladding layer, and the latter is a standard SCL layer.

Formed on the cladding/SCL layer, 35, is an active layer, 36, which in this example is a multi-quantum well layer comprising InGaAsP layers of different composition so as to form layers of active quantum well material separated by barrier layers according to principles well known in the art. The layer, 36, is typically undoped (intrinsic). The typical thickness of the layer, 36, is 0.09 to 0.2 microns.

A second cladding/SCL layer, 37, which is similar to the layer, 35, but with p-type conductivity, is formed on the active layer, 36. In this example, the layer, 37, includes a cladding layer comprising InP with a thickness within the range 0.2 to 0.7 microns, and an SCL layer comprising InGaAsP with a thickness within the range 0.02 to 0.10 microns.

A mask, 60, is then formed on the surface of the layer, 37, by first depositing a suitable material, such as silicon dioxide, and then patterning the material by standard photolithographic techniques.

Figure 4:
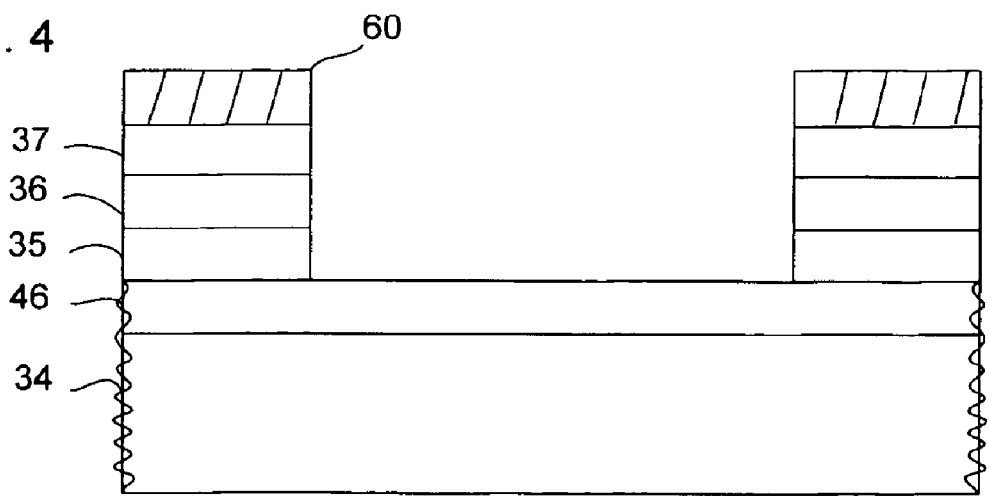

The portions of the semiconductor layers, 35–37, which are exposed by the mask, 60, are then etched such that the final etching stops on layer 46 as illustrated in FIG. 4. An etchant, such as $HCl:H_3PO_4$ is used so that layer 46 is not substantially etched.

Figure 5:
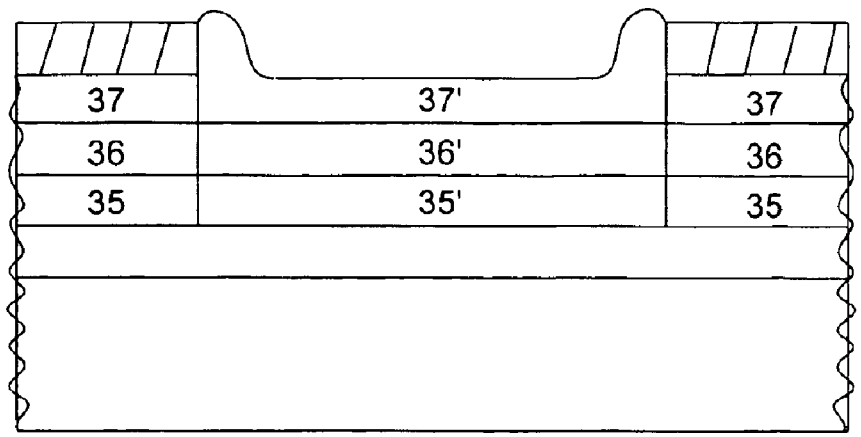

Next, as illustrated in FIG. 5, a new cladding/SCL layer, 35', active layer 36', and cladding/SCL layer, 37' are sequentially formed in the etched out areas. These layers, 35'–37' are essentially the same as the corresponding layers, 35–37, except that the composition and/or thicknesses are optimized for a modulator component (32 of FIG. 2) If desired, a new mask (not shown) can be formed to expose the area which will become the SOA component (33 of FIG. 2), the exposed area etched, and then layers 35–37 regrown in the etched out areas to optimize the SOA device in a manner similar to the optimization of the modulator component. For the sake of exposition, it will be assumed that layers 35–37 are already optimized for laser and SOA components in the required areas.

Figure 6:
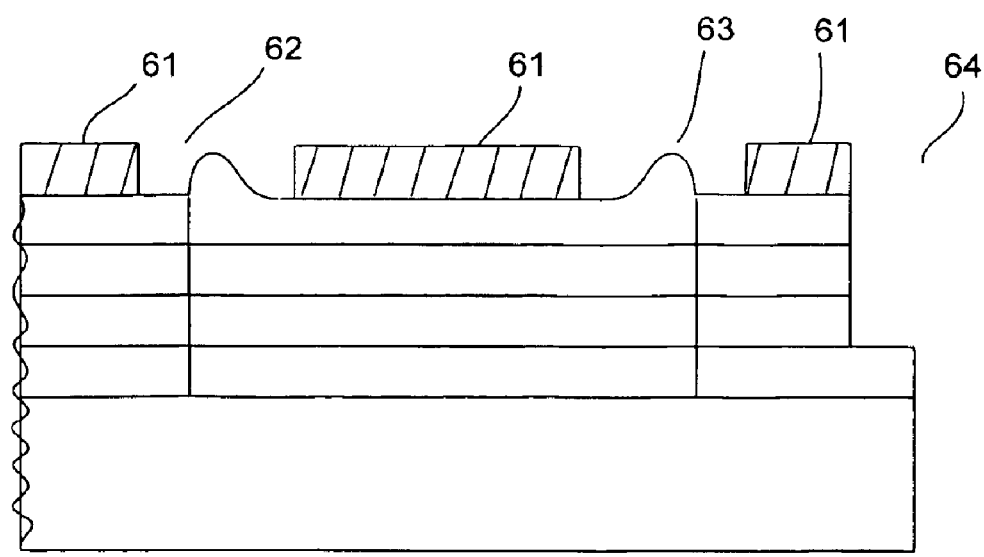

Next, as illustrated in FIG. 6, a second mask, 61, is formed over the surface of the structure of FIG. 5. Again, the mask can be formed by depositing a layer of material such as silicon dioxide, and then patterning the layer by standard photolithographic techniques. In this step, the mask is patterned to expose the areas of the structure which will comprise the interconnection portions, 62 and 63, between the laser, modulator, and SOA components, as well as a portion, 64, at the edge of the device for coupling to some external component (not shown).

As illustrated in FIG. 7, the portions of the structure exposed by the mask, are etched down to the stop etch layer, 46, i.e., layers 35,35', 36,36', and 37,37' are selectively etched. Again, the etchant employed could be $HCl:H_3PO_4$ or any other suitable wet or dry etchant which etches the layers without affecting the mask or the stop etch layer. Subsequent to the etching step, as illustrated in FIG. 8, layers 43–45 are sequentially grown to form the optical interconnection portions, 62, 63, and 64 in the etched out areas. The mask, 61, can be used to provide selectivity in the growth process. In this example, the layers, 44 and 45, were SCL layers comprising InP, typically with a thickness in the range 0.005 to 0.6 microns. Layer, 43, sandwiched between the SCL layers was a passive waveguide layer comprising InGaAsP. The layers, 43–45 can be grown under conditions which optimize interconnection independently of the conditions for optimizing the device components. For example, the passive waveguide must be aligned to the two dissimilar device active regions such that low loss mode transfer occurs.

The mask. 61, can then be removed, and the structure completed by depositing the necessary electrodes to the top and bottom surfaces of the structure and cleaving the structure according to standard techniques to produce the device depicted in FIG. 2.

What is claimed is:

1. An optoelectronic device comprising at least two spatially separate optical components formed on a single semiconductor substrate, each optical component including an active region, and a passive waveguide formed over the substrate and optically butt coupling the two components, wherein each component includes a cladding layer on either side of the active region, and further comprising a cladding layer on either side of the passive waveguide.

2. The device according to claim 1 wherein the active regions comprise multi-quantum well layers.

3. The device according to claim 1 comprising at least three optical components of different types.

4. The device according to claim 3 wherein the device comprises a laser, a modulator, and an optical amplifier.

5. The device according to claim 2 wherein the multi-quantum layers comprise InGaAsP.

6. The device according to claim 1 wherein each component further comprises a separate confinement layer on either side of the active region.

7. The device according to claim 1 further comprising a stop-etch layer formed over the substrate.

8. The device according to claim 7 wherein the stop-etch layer comprises InAlAs or GaInAlAs.

9. The device according to claim 1 wherein the passive waveguide comprises an identical composition between the components.

10. A method of forming an optoelectronic device comprising:

forming a plurality of epitaxial semiconductor layers on essentially the entire surface of a semiconductor substrate, the layers including at least one layer of an active material;

selectively etching the layers to form spatially separate structures including the active material; and forming at least one passive waveguide layer in the etched areas so as to provide optical butt coupling between the active material of the separate structures, wherein a plurality of layers including the passive waveguide layer are sequentially formed in the etched areas, and the plurality of layers formed in the etched areas includes cladding layers.

11. The method according to claim 10 further comprising, prior to forming the active material, forming an etch-stop layer over the substrate, and selectively etching the epitaxial layers down to the etch-stop layer.

12. The method according to claim 11 wherein the etch-stop layer comprises InAlAs or GaInAlAs.

13. The method according to claim 10 wherein the active material comprises InGaAsP, and the passive waveguide comprises InGaAsP.

14. The method according to claim 10 wherein, prior to forming the passive waveguide, a separate plurality of epitaxial layers is formed for each type of optical component on the substrate.

15. The method according to claim 10 wherein the spatially separate structures are formed into at least a laser, modulator, and optical amplifier.

16. A method of forming an optoelectronic device including at least a laser, modulator, and optical amplifier on a single substrate comprising the steps of forming an etch-stop layer comprising InAlAs or GaInAlAs on a surface of the substrate;

separately forming a plurality of epitaxial layers over the substrate for each of the laser, modulator, and amplifier, the plurality of layers including multi-quantum active layers comprising InGaAsP;

selectively etching the plurality of epitaxial layers down to the etch-stop layer to form spatially separate structures;

sequentially forming a first cladding layer comprising InP, a passive waveguide layer comprising InGaAsP, and a second cladding layer comprising InP in the etched areas so as to form butt joints between the active layers and passive waveguide layer; and forming the spatially separate structures into the laser, modulator, and optical amplifier.

* * * * *